United States Patent
Roy et al.

(10) Patent No.: US 9,530,771 B2
(45) Date of Patent: Dec. 27, 2016

(54) FEEDBACK AND IMPEDANCE CIRCUITS, DEVICES AND METHODS FOR BROADBAND RADIO-FREQUENCY AMPLIFIERS

(71) Applicant: SKYWORKS SOLUTIONS, INC., Woburn, MA (US)

(72) Inventors: Ambarish Roy, Waltham, MA (US); Eric Marsan, Lowell, MA (US); Stephen Richard Moreschi, Peabody, MA (US)

(73) Assignee: Skyworks Solution, Inc., Woburn, MA (US)

( * ) Notice: Subject to any disclaimer, the term of this patent is extended or adjusted under 35 U.S.C. 154(b) by 1 day.

(21) Appl. No.: 14/541,351

(22) Filed: Nov. 14, 2014

(65) Prior Publication Data
US 2015/0207475 A1    Jul. 23, 2015

Related U.S. Application Data

(60) Provisional application No. 61/905,133, filed on Nov. 15, 2013.

(51) Int. Cl.
| | |
|---|---|
| H03F 3/04 | (2006.01) |
| H01L 27/06 | (2006.01) |
| H01L 21/8252 | (2006.01) |
| H03F 1/22 | (2006.01) |
| H03F 1/56 | (2006.01) |
| H03F 3/195 | (2006.01) |

(52) U.S. Cl.
CPC ....... *H01L 27/0629* (2013.01); *H01L 21/8252* (2013.01); *H01L 27/0605* (2013.01); *H03F 1/223* (2013.01); *H03F 1/56* (2013.01); *H03F 3/195* (2013.01); *H01L 2224/05554* (2013.01); *H01L 2224/48091* (2013.01); *H01L 2224/48227* (2013.01); *H01L 2924/15192* (2013.01); *H01L 2924/15313* (2013.01); *H01L 2924/181* (2013.01); *H01L 2924/19105* (2013.01); *H03F 2200/135* (2013.01); *H03F 2200/222* (2013.01); *H03F 2200/294* (2013.01); *H03F 2200/387* (2013.01); *H03F 2200/451* (2013.01)

(58) Field of Classification Search
CPC ..................................................... H03F 1/223
USPC ........................... 330/311, 302–306, 98, 296
See application file for complete search history.

(56) References Cited

U.S. PATENT DOCUMENTS

| | | | |
|---|---|---|---|
| 6,850,120 B2 * | 2/2005 | Heima | H03F 3/193 330/285 |
| 8,493,154 B1 * | 7/2013 | Camargo | H03F 1/223 330/296 |

* cited by examiner

*Primary Examiner* — Khanh V Nguyen
*Assistant Examiner* — Khiem Nguyen
(74) *Attorney, Agent, or Firm* — Chang & Hale LLP

(57) ABSTRACT

Feedback and impedance circuits, devices and methods for broadband radio-frequency (RF) amplifiers. An RF amplifier architecture can include an amplifier having a first field-effect transistor (FET) and a second FET arranged in a cascode configuration. The gate of the first FET can be configured to receive an RF signal, the drain of the first FET can be coupled to the source of the second FET, and the drain of the second FET can be configured to output an amplified RF signal. The RF amplifier architecture can further include a first feedback circuit implemented between the drain of the second FET and the gate of the second FET to provide gain control, and a second feedback circuit implemented between the drain of the second FET and the gate of the first FET to provide an increase in a frequency range having a desirable range of gain.

19 Claims, 13 Drawing Sheets

| COMPONENT | VALUE | SIZE | MANUFACTURER | PART NUMBER |
|---|---|---|---|---|
| C1 | 1000pF | 0402 | XYZ | XYZ-1000PF-0402 |
| C2 | 1000pF | 0402 | XYZ | XYZ-1000PF-0402 |
| C3 | 1000pF | 0402 | XYZ | XYZ-1000PF-0402 |
| C4 | 1000pF | 0402 | XYZ | XYZ-1000PF-0402 |
| C5 | 200pF | 0402 | XYZ | XYZ-200PF-0402 |
| L1 | 20nH | 0402 | ZYX | ZYX-20NH-0402 |
| L2 | 40nH | 0402 | ZYX | ZYX-40NH-0402 |

FEEDBACK AND IMPEDANCE CIRCUITS, DEVICES AND METHODS FOR BROADBAND RADIO-FREQUENCY AMPLIFIERS

CROSS-REFERENCE TO RELATED APPLICATION(S)

This application claims priority to U.S. Provisional Application No. 61/905,133 filed Nov. 15, 2013, entitled FEEDBACK AND IMPEDANCE CIRCUITS, DEVICES AND METHODS FOR BROADBAND RADIO-FREQUENCY AMPLIFIERS, the disclosure of which is hereby expressly incorporated by reference herein in its entirety.

BACKGROUND

Field

The present disclosure generally relates to feedback and impedance circuits for broadband radio-frequency amplifiers.

Description of the Related Art

In many radio-frequency (RF) applications, low-noise amplifiers (LNAs) are typically utilized to amplify relatively weak signals received through an antenna. A broadband LNA can be configured to amplify one or more of such signals associated with different frequency bands.

SUMMARY

In accordance with some implementations, the present disclosure relates to a radio-frequency (RF) amplifier architecture that includes an amplifier having a first field-effect transistor (FET) and a second FET arranged in a cascode configuration, with each of the first FET and the second FET having a gate, a source, and a drain. The gate of the first FET is coupled to an input node for receiving an RF signal, the drain of the first FET is coupled to the source of the second FET, and the drain of the second FET is coupled to an output node for outputting an amplified RF signal. The RF amplifier architecture further includes a first feedback circuit implemented between the drain of the second FET and the gate of the second FET, with the first feedback circuit being configured to provide gain control. The RF amplifier architecture further includes a second feedback circuit implemented between the drain of the second FET and the gate of the first FET, with the second feedback circuit being configured to provide an increase in a frequency range having a desirable range of gain.

In some embodiments, the RF amplifier architecture can further include a passive circuit implemented to provide stability for the RF amplifier. The passive circuit can include a first portion implemented between the source of the first FET and a ground, and a second portion implemented between the drain of the first FET and the source of the second FET. The passive circuit can be configured to provide stability for the amplifier when additional noise and impedance change are introduced by the second feedback circuit.

In some embodiments, the amplifier can be a low-noise amplifier (LNA). Each of the first FET and the second FET can be a pseudomorphic high-electron-mobility transistor (pHEMT). The pHEMT can include a gallium arsenide (GaAs) substrate.

In some embodiments, the RF amplifier architecture can further include one or more matching circuits implemented to provide impedance matching for either or both of the received RF signal and the amplified RF signal.

In some embodiments, each of the first feedback circuit, the second feedback circuit, and the passive circuit can be implemented on a die having the amplifier. Accordingly, an additional bill of materials may not be needed to implement one or more functionalities associated with the RF amplifier architecture. Such functionalities can include a broadband functionality.

In some embodiments, the first feedback circuit can include a first parallel combination and a second parallel combination connected in series between the drain of the second FET and the ground. The first parallel combination can include a first resistance parallel with a series combination of a second resistance and a first capacitance. The second parallel combination can include a third resistance parallel with a second capacitance. A node between the first and second parallel combinations can be connected to the gate of the second FET. The second feedback circuit can include a fourth resistance in series with a third capacitance. The first portion of the passive circuit can include a parallel combination of a fifth resistance and a fourth capacitance, and the second portion of the passive circuit can include an inductance.

In some implementations, the present disclosure relates to a semiconductor die that includes a semiconductor substrate and a radio-frequency (RF) amplifier implemented on the semiconductor substrate. The RF amplifier includes a first field-effect transistor (FET) and a second FET arranged in a cascode configuration, with each of the first FET and the second FET having a gate, a source, and a drain. The gate of the first FET is coupled to an input node for receiving an RF signal, the drain of the first FET is coupled to the source of the second FET, and the drain of the second FET is coupled to an output node for outputting an amplified RF signal. The semiconductor die further includes a first feedback circuit implemented on the semiconductor substrate. The first feedback circuit is configured to couple the drain of the second FET and the gate of the second FET, and to provide gain control. The semiconductor die further includes a second feedback circuit implemented on the semiconductor substrate. The second feedback circuit is configured to couple the drain of the second FET and the gate of the first FET, and to provide an increase in a frequency range having a desirable range of gain. The semiconductor die further includes a passive circuit implemented on the semiconductor substrate. The passive circuit is configured to provide stability for the RF amplifier.

In some embodiments, the semiconductor substrate can include gallium arsenide (GaAs). In some embodiments, the RF amplifier can be a low-noise amplifier (LNA). In some embodiments, each of the first FET and the second FET can be a pseudomorphic high-electron-mobility transistor (pHEMT).

According to a number of teachings, the present disclosure relates to a method of fabricating a radio-frequency (RF) die. The method includes providing a semiconductor substrate, and forming a radio-frequency (RF) amplifier on the semiconductor substrate. The RF amplifier includes a first field-effect transistor (FET) and a second FET arranged in a cascode configuration, with each of the first FET and the second FET having a gate, a source, and a drain. The gate of the first FET is coupled to an input node for receiving an RF signal, the drain of the first FET is coupled to the source of the second FET, and the drain of the second FET is coupled to an output node for outputting an amplified RF signal. The method further includes forming a first feedback circuit on the semiconductor substrate. The first feedback circuit is configured to couple the drain of the second FET and the gate of the second FET, and to provide gain control. The method further includes forming a second feedback circuit on the semiconductor substrate. The second feedback circuit is configured to couple the drain of the second FET and the gate of the first FET, and to provide an increase in a frequency range having a desirable range of gain. The method further includes forming a passive circuit on the semiconductor substrate. The passive circuit is configured to provide stability for the RF amplifier.

In some embodiments, the RF amplifier can be a low-noise amplifier (LNA). In some embodiments, the semiconductor substrate can be a GaAs substrate.

In accordance with a number of implementations, the present disclosure relates to a radio-frequency (RF) module having a packaging substrate configured to receive a plurality of components, and a die mounted on the packaging substrate. The die includes an RF amplifier having a first field-effect transistor (FET) and a second FET arranged in a cascode configuration, with each of the first FET and the second FET having a gate, a source, and a drain. The gate of the first FET is coupled to an input node for receiving an RF signal, the drain of the first FET is coupled to the source of the second FET, and the drain of the second FET is coupled to an output node for outputting an amplified RF signal. The die further includes a first feedback circuit configured to couple the drain of the second FET and the gate of the second FET, and to provide gain control. The die further includes a second feedback circuit configured to couple the drain of the second FET and the gate of the first FET, and to provide an increase in a frequency range having a desirable range of gain. The die further includes a passive circuit configured to provide stability for the RF amplifier.

In some implementations, the present disclosure includes a wireless device that includes a transceiver configured to process radio-frequency (RF) signals, and an antenna in communication with the transceiver and configured to facilitate reception of an RF signal. The wireless device further includes a low-noise amplifier (LNA) in communication with the antenna. The LNA is configured to amplify the RF signal, and includes a first field-effect transistor (FET) and a second FET arranged in a cascode configuration. The wireless device further includes a broadband circuit coupled to the LNA. The broadband circuit is configured to increase operating frequency range of the LNA. The broadband circuit includes a first feedback circuit between a drain of the second FET and a gate of the second FET. The broadband circuit further includes a second feedback circuit between the drain of the second FET and a gate of the first FET. The broadband circuit further includes a passive circuit configured to provide stability for the LNA.

In some embodiments, the passive circuit includes a parallel combination of a resistance and a capacitance between a source of the first FET and a ground, and an inductance between a drain of the first FET and a source of the second FET.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figures 1, 2:
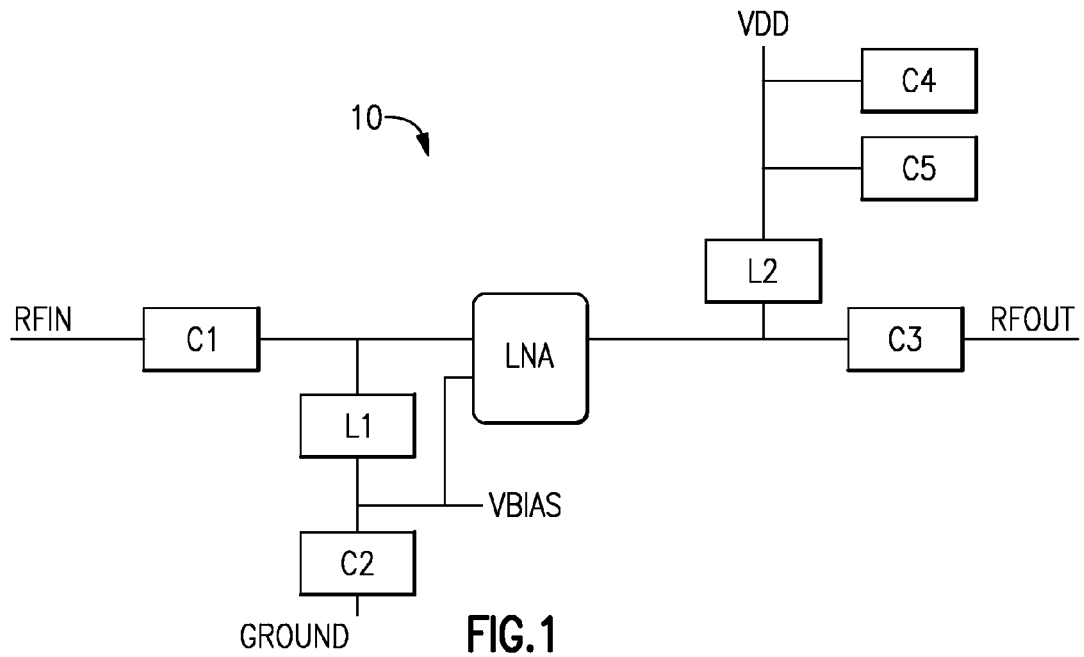
FIG. 1 shows a schematic diagram of an example radio-frequency (RF) amplification architecture.
FIG. 2 shows an example bill of materials (BOM) for the components associated with matching networks of the architecture of FIG. 1.

FIG. 1 shows a schematic diagram of an example radio-frequency (RF) amplification architecture 10. Such an architecture can be implemented utilizing, for example, a low-noise amplifier (LNA) to amplify relatively weak signals that have been received by an antenna. Although described in such a context, it will be understood that one or more features of the present disclosure can also be implemented in other types of RF amplification applications.

In FIG. 1, example matching networks for input (RFIN) and output (RFOUT) of the LNA are schematically depicted. In some applications, some or all of such networks can be implemented on a circuit board such as a phone board, and the LNA itself can be a component to be installed on the circuit board. Based on some desired or required performance specification for the overall RF amplification architecture 10 and/or the performance of the LNA, recommended specifications for the various components of the matching networks, as well as any other related circuits, can be provided. Such component-specifications are sometimes referred to as a bill of materials, or simply BOM. FIG. 2 shows an example BOM for the components associated with the matching networks of FIG. 1.

Preferably, a BOM for a given amplifier is kept versatile to allow operation of the amplifier in as many frequency ranges and/or modes as possible. Further, as wireless devices become smaller and/or more complex, smaller areas occupied by components of such BOM are desired or required. Thus, having a relatively small number of components in a BOM is also desirable. In some situations, integration of components into a part being installed on a circuit board can also facilitate such desirable features. Examples of such integration of components into, for example, an LNA die, are described herein in greater detail.

Figure 3:
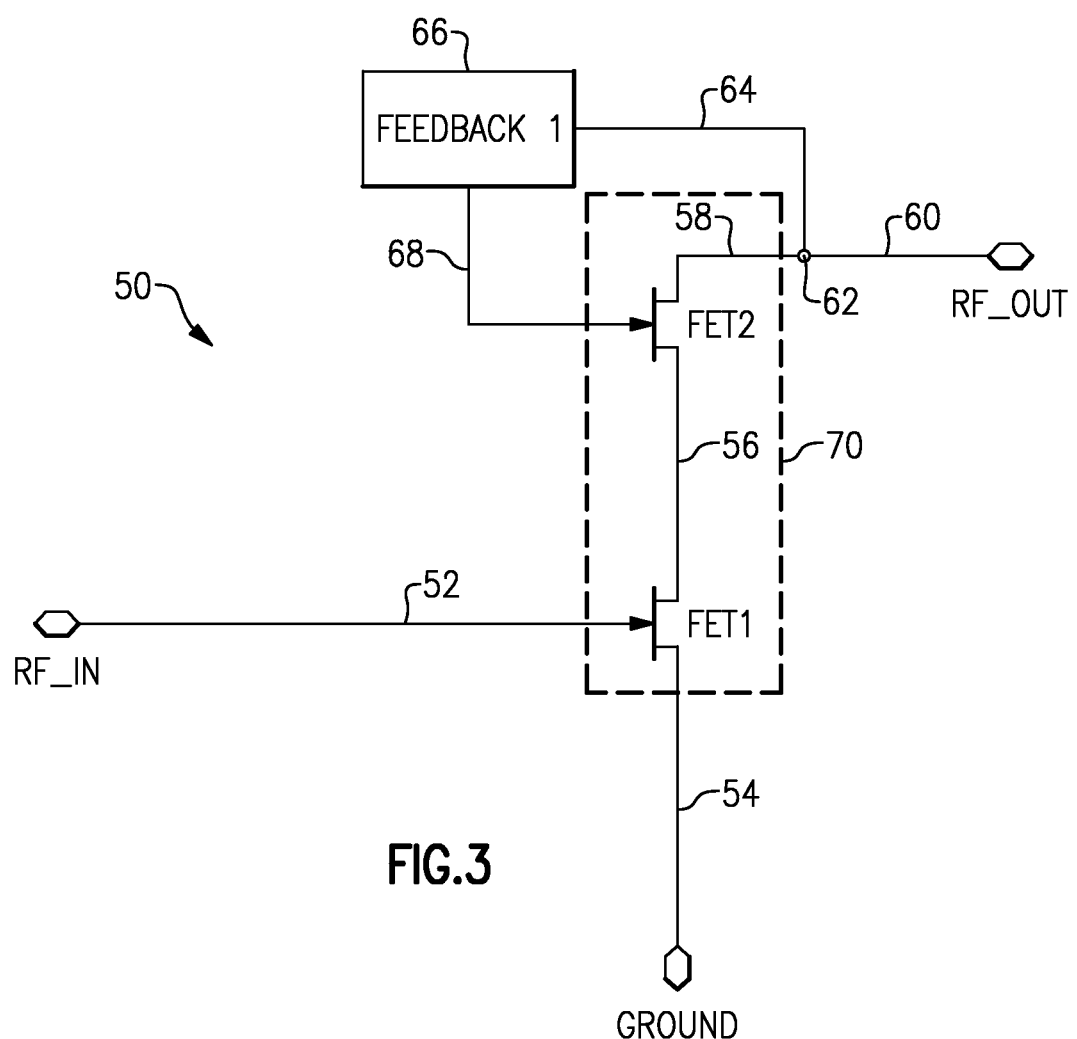
FIG. 3 shows an example configuration where a feedback circuit is coupled to a low-noise amplifier (LNA) to provide performance enhancement.

In general, achievement of high performance of an RF amplifier such as an LNA is desirable. FIG. 3 shows an example configuration 50 where a feedback circuit 66 is coupled to an LNA 70 to provide performance enhancement. Depending on the level of integration, such a feedback circuit can have associated with it a BOM. If the entire architecture 50 is integrated into a single device such as a die, implementation of the feedback circuit does not necessarily need to add any component to an existing BOM.

In the example of FIG. 3, the LNA 70 is depicted as having a cascode configuration including an input field-effect transistor (FET) FET1 coupled with a buffer FET (FET2). The input FET (FET1) is shown to receive, at its gate, an input RF signal through an input node RF_IN and an input path 52. The source of the input FET (FET1) is shown to be coupled to a ground (through path 54), and the drain of the input FET (FET1) is shown to be coupled to a source of the buffer FET (FET2) through path 56. The drain of the buffer FET (FET2) is shown to provide an output for the amplified RF signal; and accordingly is coupled to an output node RF_OUT (through path 58 and 60). In some embodiments, the foregoing example FETs can be implemented as gallium arsenide (GaAs) pseudomorphic high-electron-mobility transistor (pHEMT) process technology. However, it will be understood that one or more features of the present disclosure can be implemented in other types of process technologies.

In the example of FIG. 3, the feedback circuit 66 is shown to form a feedback loop with the buffer FET (FET2). More particularly, the feedback circuit 66 is coupled to the drain of FET2 (at node 62) by a path 64, and to the gate of FET2 by a path 68. Such a feedback loop can be configured to provide gain control of the buffer FET (FET2), and thus the LNA itself.

Figure 4:
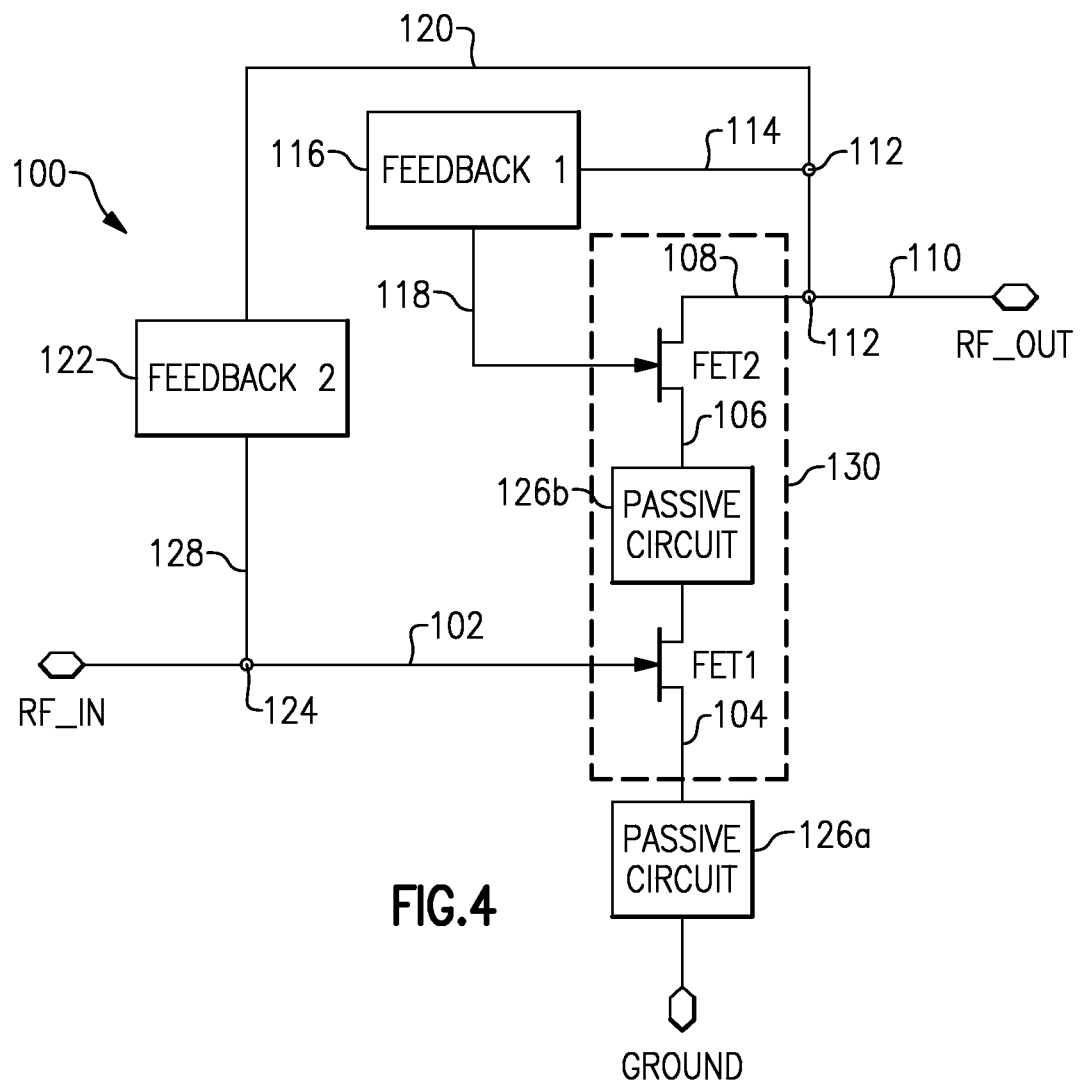
FIG. 4 shows an example configuration where a first feedback circuit can be coupled to an LNA to provide performance enhancement in a manner similar to the feedback circuit of FIG. 3, and where a second feedback circuit can be configured to provide, for example, a flatter gain profile for a larger frequency range for the LNA.

FIG. 4 shows an example configuration 100 where a first feedback circuit 116 is coupled to an LNA 130 to provide performance enhancement in a manner similar to the feedback circuit 66 of FIG. 3. An example of the first feedback circuit 116 is described herein in greater detail.

Similar to the example of FIG. 3, the LNA 130 of FIG. 4 is depicted as having a cascode configuration, and including an input field-effect transistor (FET) FET1 that receives, at its gate, an input RF signal through an input node RF_IN and an input path 102. The source of the input FET (FET1) is shown to be coupled to a ground (through path 104), and the drain of the input FET (FET1) is shown to be coupled to a source of a buffer FET (FET2) through path 106. The drain of the buffer FET (FET2) is shown to provide an output for the amplified RF signal; and accordingly is coupled to an output node RF_OUT (through path 108 and 110). In some embodiments, the foregoing example FETs can be implemented as gallium arsenide (GaAs) pseudomorphic high-electron-mobility transistor (pHEMT) process technology. However, it will be understood that one or more features of the present disclosure can be implemented in other types of process technologies.

In the example of FIG. 4, the feedback circuit 116 is shown to form a feedback loop with the buffer FET (FET2). More particularly, the feedback circuit 116 is coupled to the drain of FET2 (at node 112) by a path 114, and to the gate of FET2 by a path 118. Such a feedback loop can be configured to provide, for example, gain control of the buffer FET (FET2), and thus the LNA itself.

In the example configuration 100 of FIG. 4, a second feedback circuit 122 is shown to couple the drain of FET2 (at node 112, by a path 120) and the gate of FET1 (at node 124, by a path 128). In some embodiments, the second feedback circuit 122 can be configured to provide, for example, a flatter gain profile for a larger frequency range for the LNA 130. For example, the second feedback circuit 122 can facilitate maintenance of the gain of the amplifier from degrading at higher frequencies. Examples of the second feedback circuit 122 and related performance improvements are described herein in greater detail.

In some situations, the second feedback circuit 122 can introduce noise and/or change impedance characteristics for the input FET (FET1). In the context of LNAs, such an input FET is typically sensitive to noise by design. Accordingly, the additional noise and/or change in impedance resulting from the second feedback circuit 122 can result in instable operation of FET1.

FIG. 4 shows that in some embodiments, one or more passive circuits 126a, 126b can be provided to, for example, maintain and/or improve stability. The passive circuit 126a can be configured to couple the source of FET1 (through a path 104) to the ground. The passive circuit 126b can be configured to couple the drain of FET1 to the source of FET2 (through path 106). Examples of the passive circuits 126a, 126b and related performance improvements are described herein in greater detail.

In some embodiments, some or all of the first feedback circuit 116, the second feedback circuit 122 and the passive circuits 126a, 126b can be implemented on the same die on which the LNA 130 is formed. For example, a die having the LNA 130 and substantially all of the first feedback circuit 116, the second feedback circuit 122 and the passive circuits 126a, 126b can be tuned to provide broadband functionality for a system design that specifies one amplifier (e.g., LNA 130) and a single 50 Ohm existing bill of material to meet certain performance levels and operate at multiple RF bands. One can see how the foregoing feature of the feedback circuits and the passive circuits being able to be implemented in such an integrated manner can be desirable from various design and manufacturing perspectives.

Figure 5:
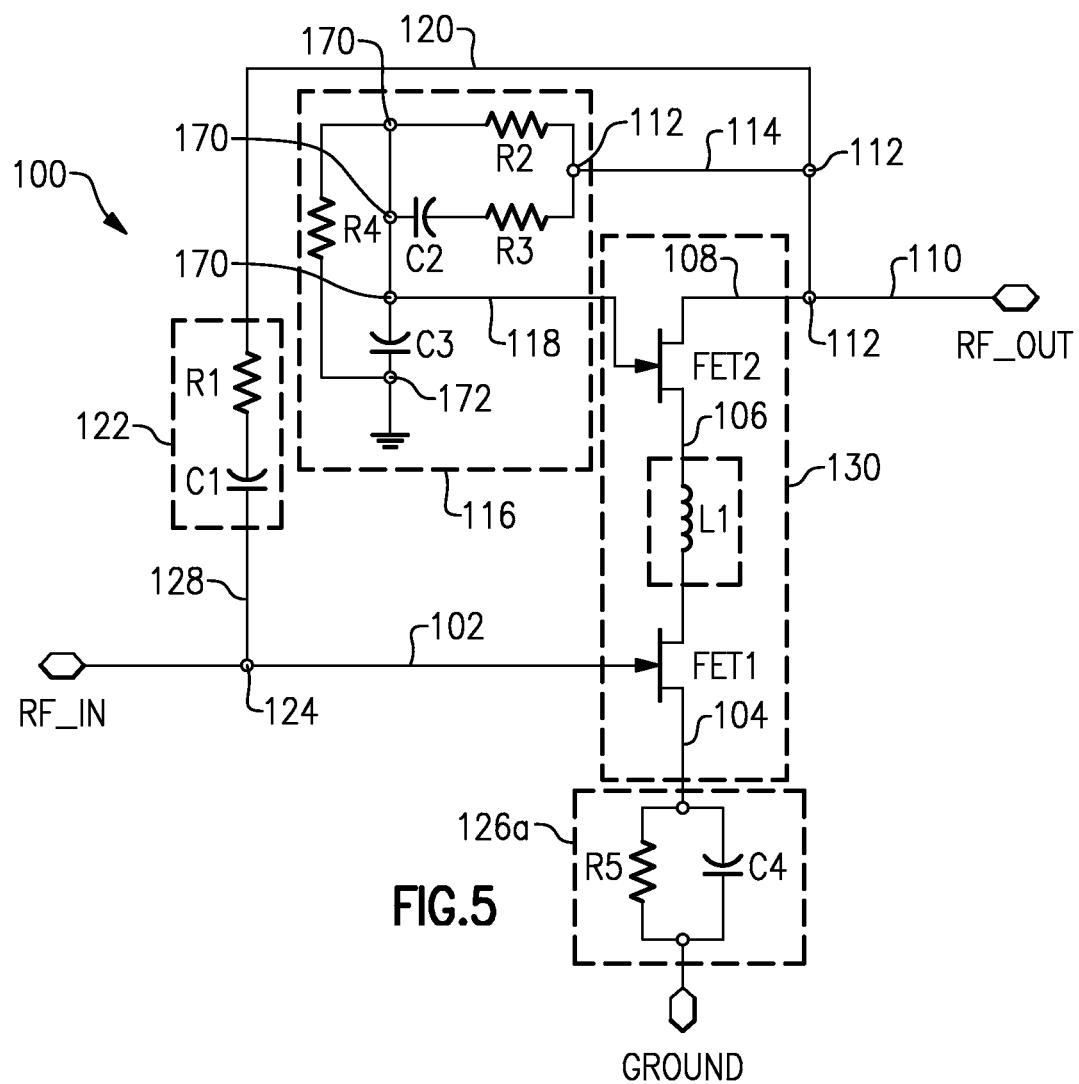
FIG. 5 shows non-limiting examples of the first feedback circuit, the second feedback circuit, and the passive circuits, in the example LNA architecture of FIG. 4.

FIG. 5 shows non-limiting examples of the first feedback circuit 116, the second feedback circuit 122, and the passive circuits 126a, 126b, in the example LNA architecture 100 of FIG. 4. The first feedback circuit 116 can include a first parallel combination of two paths between the node 112 and a node 170, and a second parallel combination of two paths between the node 170 and a node 172 which is connected to a ground. The node 170 is shown to be connected to the gate of FET2 through path 118.

The first path of the first parallel combination between the nodes 112 and 170 is shown to include a resistance R2 (e.g., a resistor), and the second path between the nodes 112 and 170 is shown to include a resistance R3 (e.g., a resistor) in series with a capacitance C2 (e.g., a capacitor). The first path of the second parallel combination between the nodes 170 and 172 is shown to include a resistance R4 (e.g., a resistor), and the second path between the nodes 170 and 172 is shown to include a capacitance C3 (e.g., a capacitor). Examples of values for such components are listed in Table 1.

In FIG. 5, the second feedback circuit 122 can include a series combination of a resistance R1 (e.g., a resistor) and a capacitance C1 (e.g., a capacitor) between the node 112 and the node 124. Examples of values for such components are listed in Table 1.

In FIG. 5, the passive circuit 126a can include a parallel combination of a resistance R5 (e.g., a resistor) and a capacitance C4 (e.g., a capacitor) between the source of FET1 and the ground. Examples of values for such components are listed in Table 1. The passive circuit 126b can include an inductance L1 (e.g., an inductor) between the drain of FET1 and the source of FET2. An example value for such a component is listed in Table 1.

TABLE 1

| Component | Approximate value |
|---|---|
| R1 | 500 Ohm |
| R2 | 3,000 Ohm |
| R3 | 250 Ohm |
| R4 | 5,000 Ohm |
| R5 | 3 Ohm |
| C1 | 4 pF |
| C2 | 1.5 pF |
| C3 | 3 pF |
| C4 | 12 pF |
| L1 | 0.5 nH |

As described herein, a BOM can specify a plurality of components that are needed or desired for implementation of various circuits associated with an amplifier such as an LNA. As also described herein, some embodiments of an LNA architecture can be implemented as an integrated component having substantially all of the feedback and passive circuits (e.g., 116, 122, 126a, 126b) associated with the LNA. For such an integrated component, an existing BOM may not need to be changed to benefit from use of the integrated component. Although some of the examples are described herein in such a context of integrated components, it will be understood that various features of the LNA architecture (e.g., 100 in FIGS. 4 and 5) does not necessarily need to integrated. In situations where some portions of the LNA architecture are not integrated in, for example, a die or a module; and such portions can increase the content of an existing BOM, utilize existing components in the BOM, or some combination thereof.

In the example LNA configuration 100 described herein in reference to FIGS. 4 and 5, the second feedback circuit (Feedback2) can provide gain uniformity over a relatively large frequency range. In the same example LNA configuration 100, the passive circuits (Passive) can provide stability over some or all of the same relatively large frequency range. Examples of such gain flatness and stability are described herein in greater detail.

In some embodiments, and as described herein, such performance improvement and stability can be achieved without requiring a change (e.g., addition of components) to an existing BOM. Such an implementation of feedback and passive circuits can remove complexity of design with various amplifiers for respective RF bands. Further, a single drop down replacement amplifier can be implemented for multiple RF bands with excellent performance across some or all of the entire bandwidth(s) associated with such multiple RF bands.

Figure 6A:
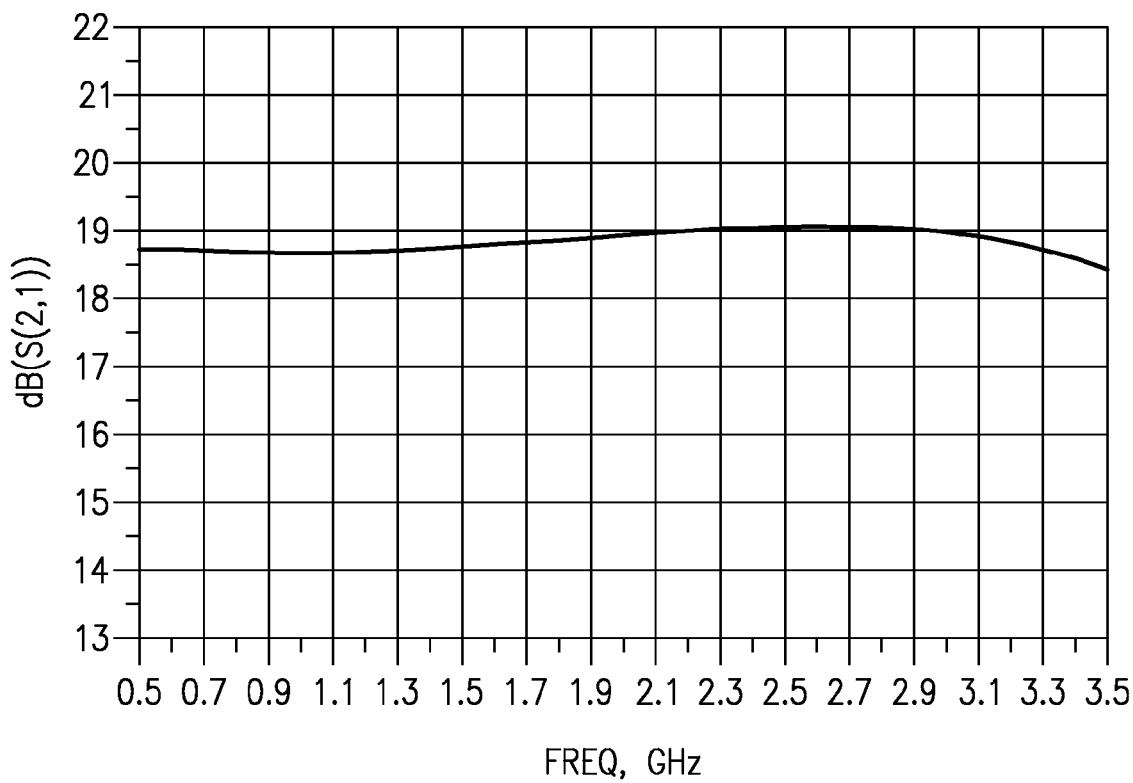
FIG. 6A shows a plot of gain magnitude (S21) over an example frequency range of 0.5 GHz to 3.5 GHz.
Figure 6B:
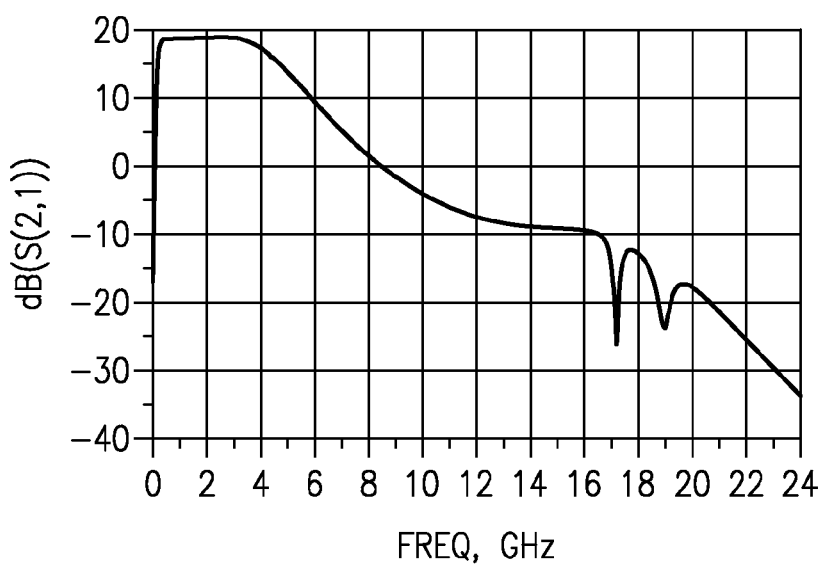
FIG. 6B shows the same S21 plot over a larger example frequency range of 0 to 24 GHz.

FIG. 6A shows a plot of gain magnitude (S21) over an example frequency range of 0.5 GHz to 3.5 GHz. FIG. 6B shows the same S21 plot over a larger example frequency range of 0 to 24 GHz. One can see that the gain has an excellent uniformity over a relative large frequency range of 0.5 GHz to 3.5 GHz, and begins to decrease above 3.5 GHz. Such a uniformity at around 18.5 dB can allow the LNA configuration (e.g., 100 in FIGS. 4 and 5) to operate as a broadband device that covers a number of RF bands.

Figure 7A:
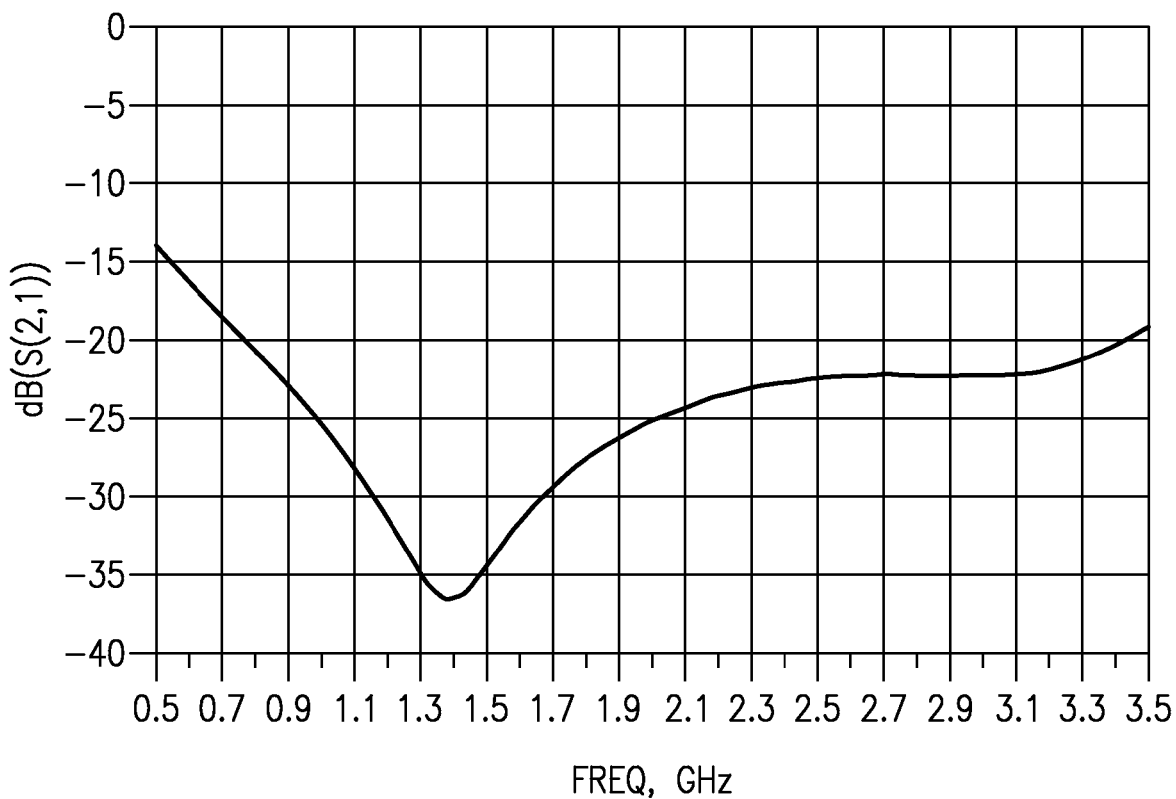
FIG. 7A shows a plot of input return loss (S11) over an example frequency range of 0.5 GHz to 3.5 GHz.
Figure 7B:
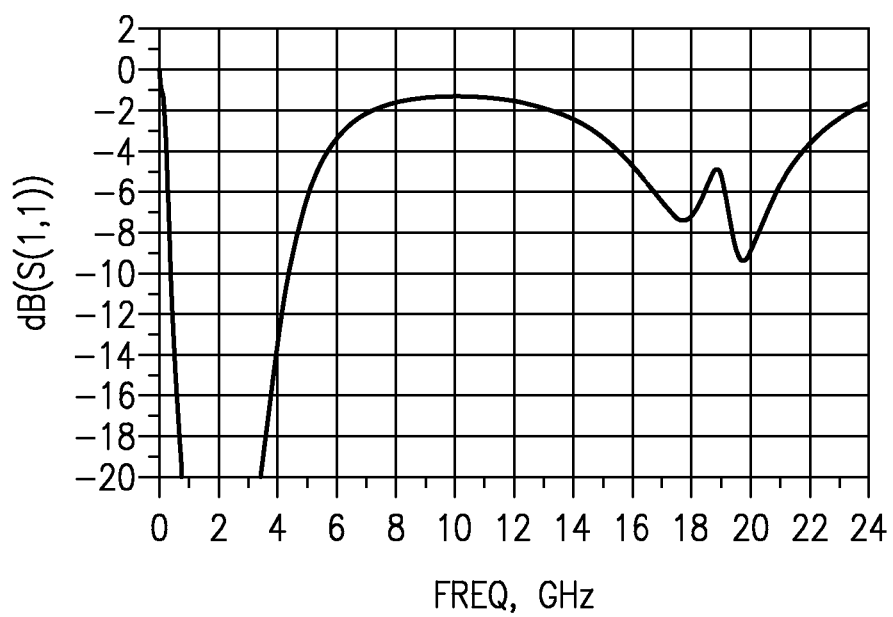
FIG. 7B shows the same S11 plot over a larger example frequency range of 0 to 24 GHz.

FIG. 7A shows a plot of input return loss (S11) over an example frequency range of 0.5 GHz to 3.5 GHz. FIG. 7B shows the same S11 plot over a larger example frequency range of 0 to 24 GHz. One can see that the input return loss curve has values that are less than, for example, −10 dB. Such an input return loss performance can allow the LNA configuration (e.g., 100 in FIGS. 4 and 5) to operate as a broadband device that covers a number of RF bands.

Figure 8A:
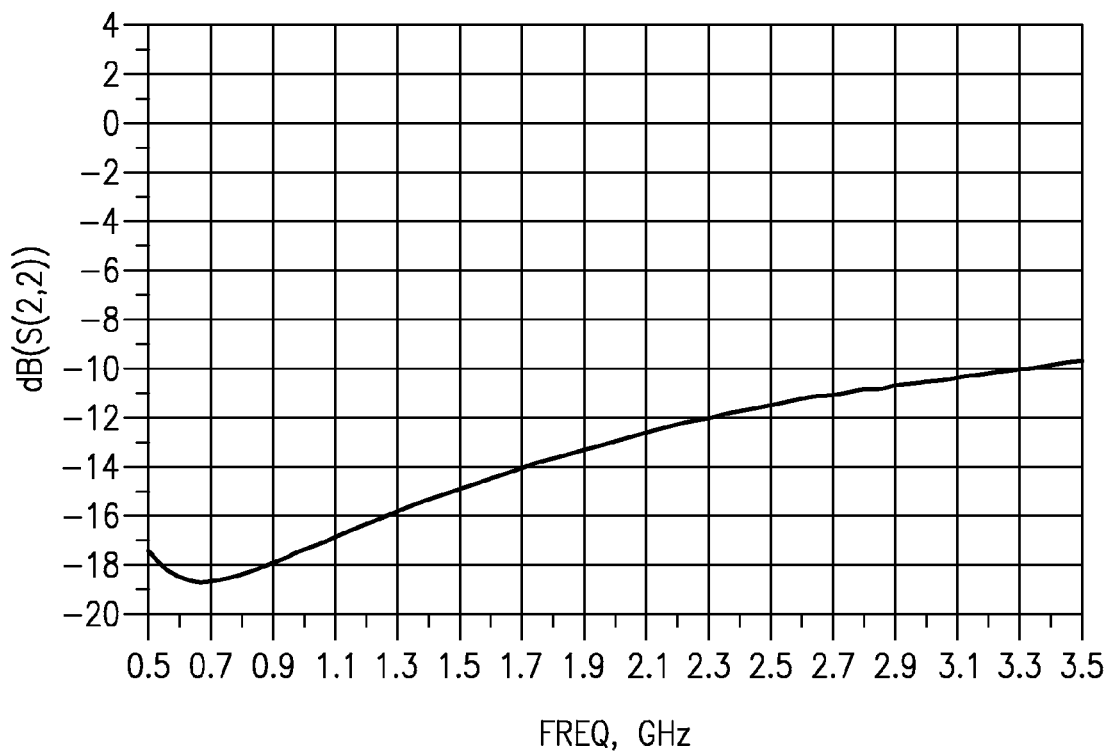
FIG. 8A shows a plot of output return loss (S22) over an example frequency range of 0.5 GHz to 3.5 GHz.
Figure 8B:
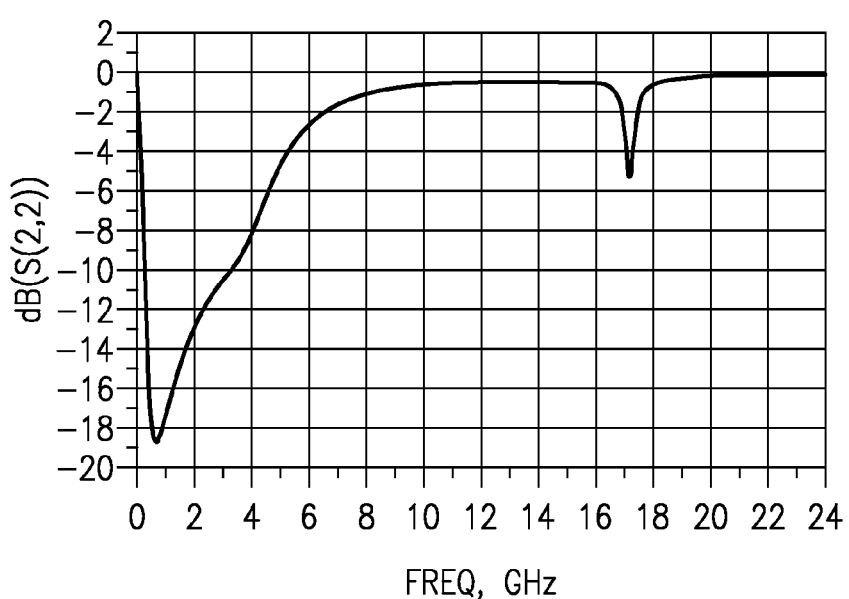
FIG. 8B shows the same S22 plot over a larger example frequency range of 0 to 24 GHz.

FIG. 8A shows a plot of output return loss (S22) over an example frequency range of 0.5 GHz to 3.5 GHz. FIG. 8B shows the same S22 plot over a larger example frequency range of 0 to 24 GHz. One can see that the output return loss curve has values that are generally less than, for example, −10 dB, with S22 slightly exceeding the −10 dB level near 3.5 GHz. Such an output return loss performance can allow the LNA configuration (e.g., 100 in FIGS. 4 and 5) to operate as a broadband device that covers a number of RF bands.

Figure 9:
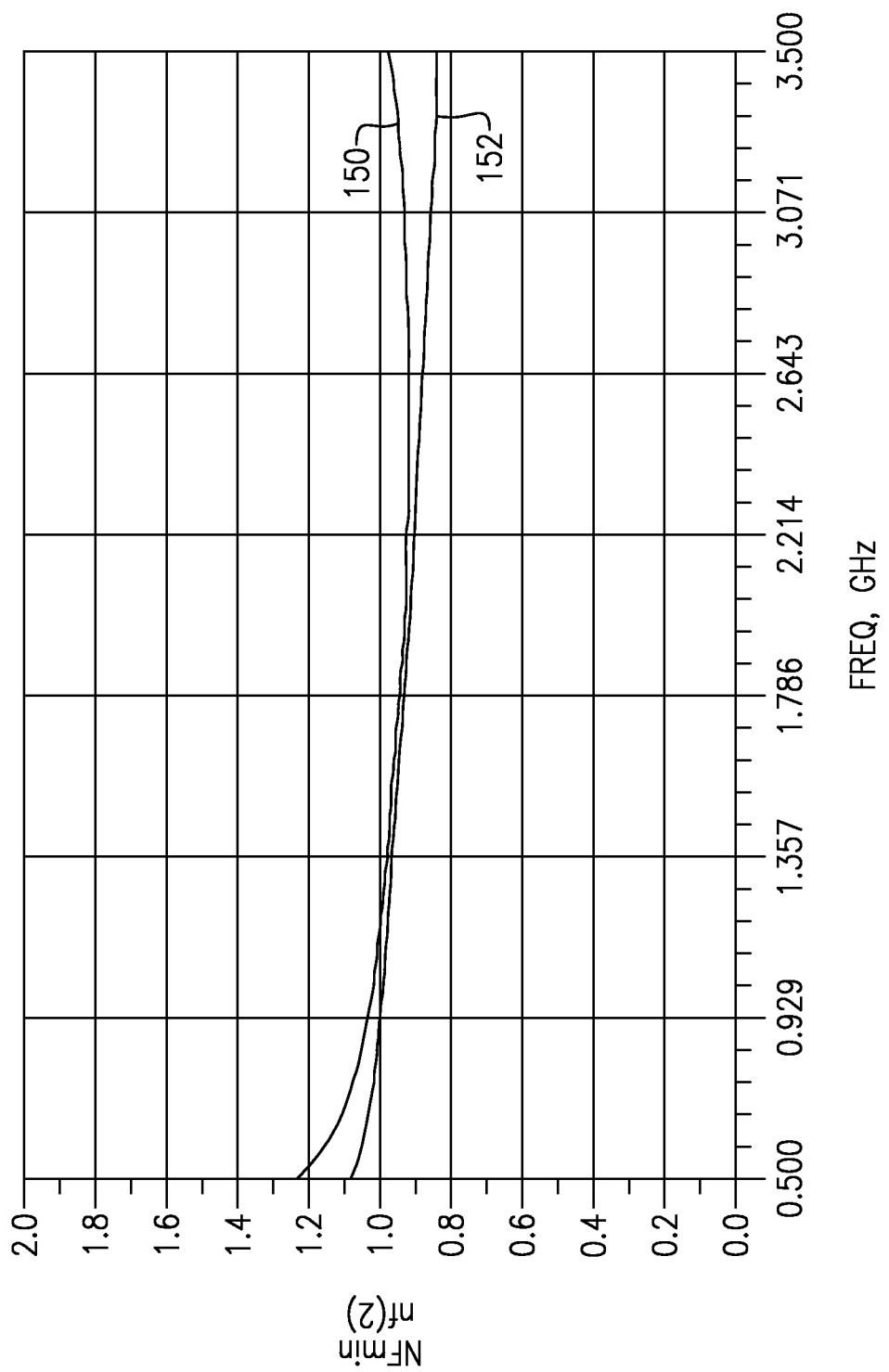
FIG. 9 shows plots of noise figure (NF) over an example frequency range of 0.5 GHz to 3.5 GHz.
Figure 10A:
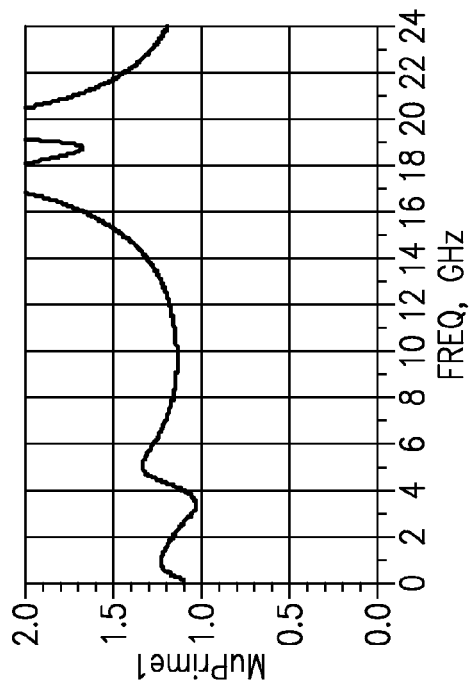
FIGS. 10A, 10B, 10C, 10D, show plots of various parameters (Mu1, Mu'1, StabFact1, StabMeas1) related to stability of the example LNA configuration of FIGS. 4 and 5.
Figure 10B:
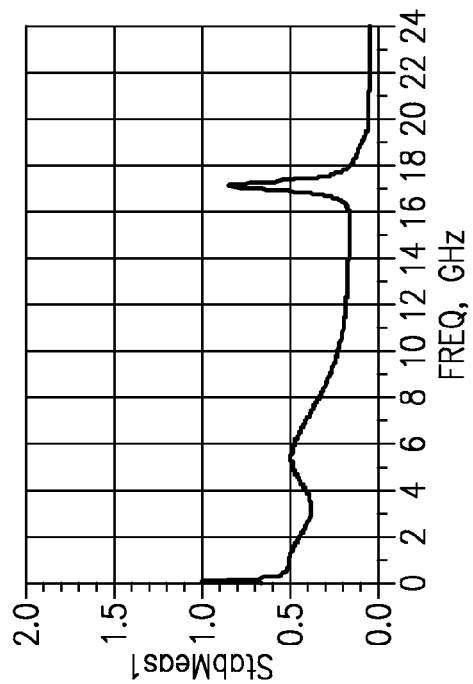
Figure 10C:
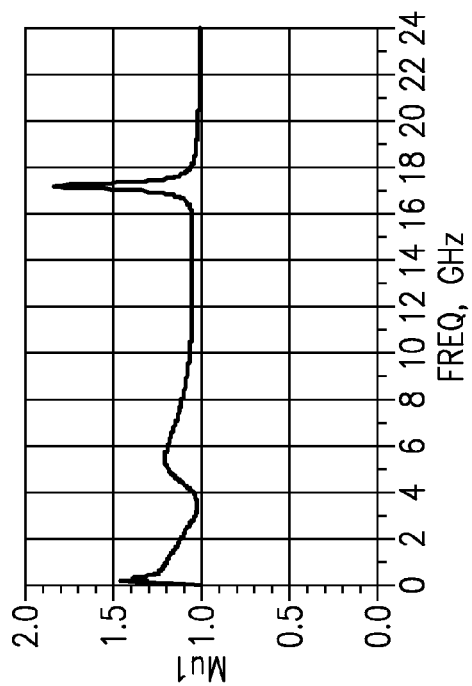
Figure 10D:
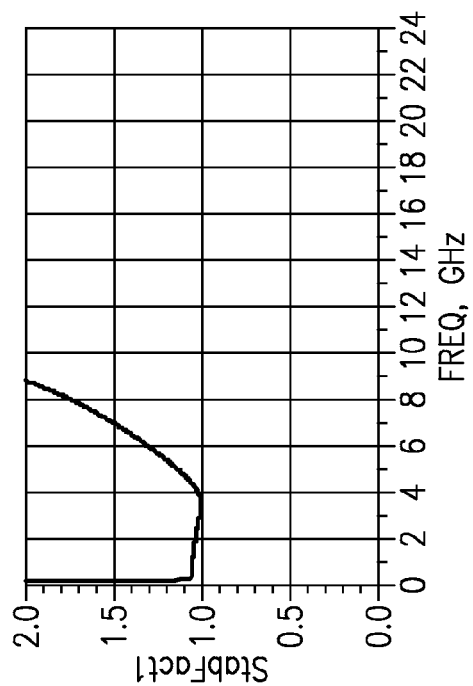

FIG. 9 shows plots of noise figure (NF) over an example frequency range of 0.5 GHz to 3.5 GHz. The upper curve 150 corresponds to the noise figure for the examples described herein in reference to FIGS. 4 and 5, and the lower curve 152 corresponds to an example minimum that can be achieved. One can see that the noise figure performance of the LNA configuration as described herein in reference to FIGS. 4 and 5 is excellent.

FIGS. 10A, 10B, 10C, 10D show plots of various parameters (Mu1, Mu'1, StabFact1, StabMeas1) related to stability of the LNA configuration as described herein in reference to FIGS. 4 and 5. For the first three parameters (FIGS. 10A-10C), it is desirable to have each parameter to remain above 1. For the last parameter (FIG. 10D), it is desirable to have the parameter above 0. One can see that all four of the example stability parameters are satisfied for the example LNA configuration.

Figure 11:
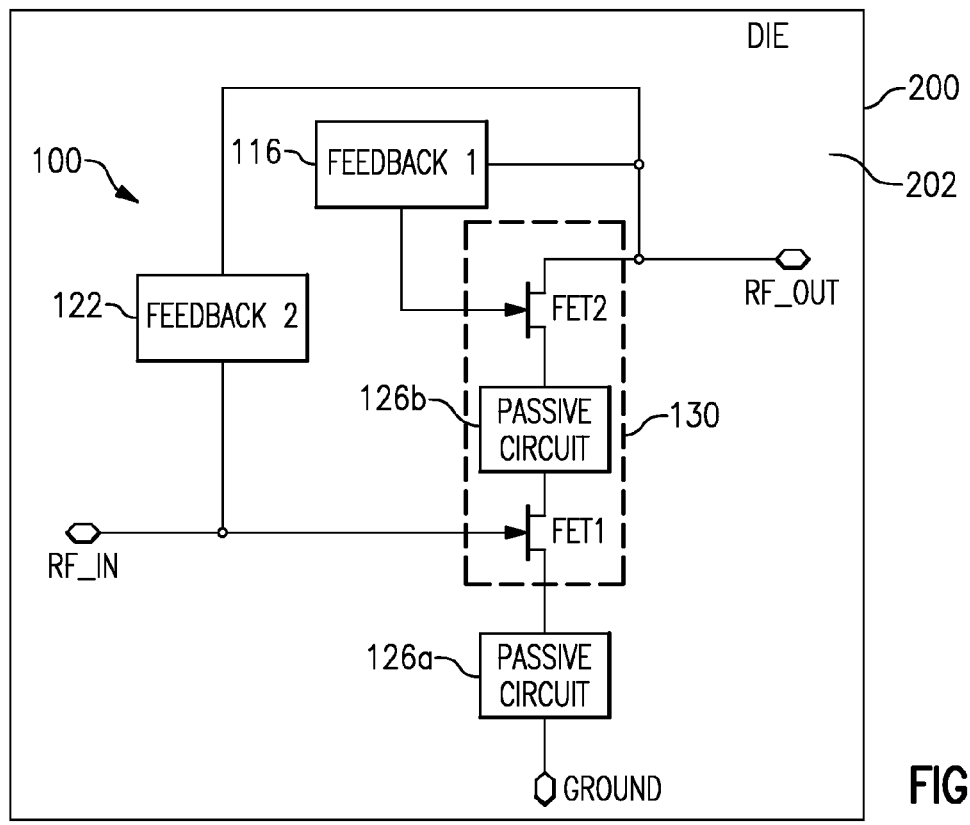
FIG. 11 shows that in some embodiments, an LNA architecture such as the example of FIG. 4 can be implemented on a common die.

FIG. 11 shows that in some embodiments, an LNA architecture 100 such as the example of FIG. 4 can be implemented on a common die 200. For example, substantially all of the LNA 130, substantially all of the first feedback circuit 116, substantially all of the second feedback circuit 122, and substantially all of the passive circuits 126a, 126b can be implemented on and/or within a substrate 202 of the die 200. In some embodiments, the substrate 202 can be a substrate utilized for the LNA 130. For example, the substrate 202 can be a GaAs substrate configured for pseudomorphic high-electron-mobility transistors (pHEMT).

Figure 12:
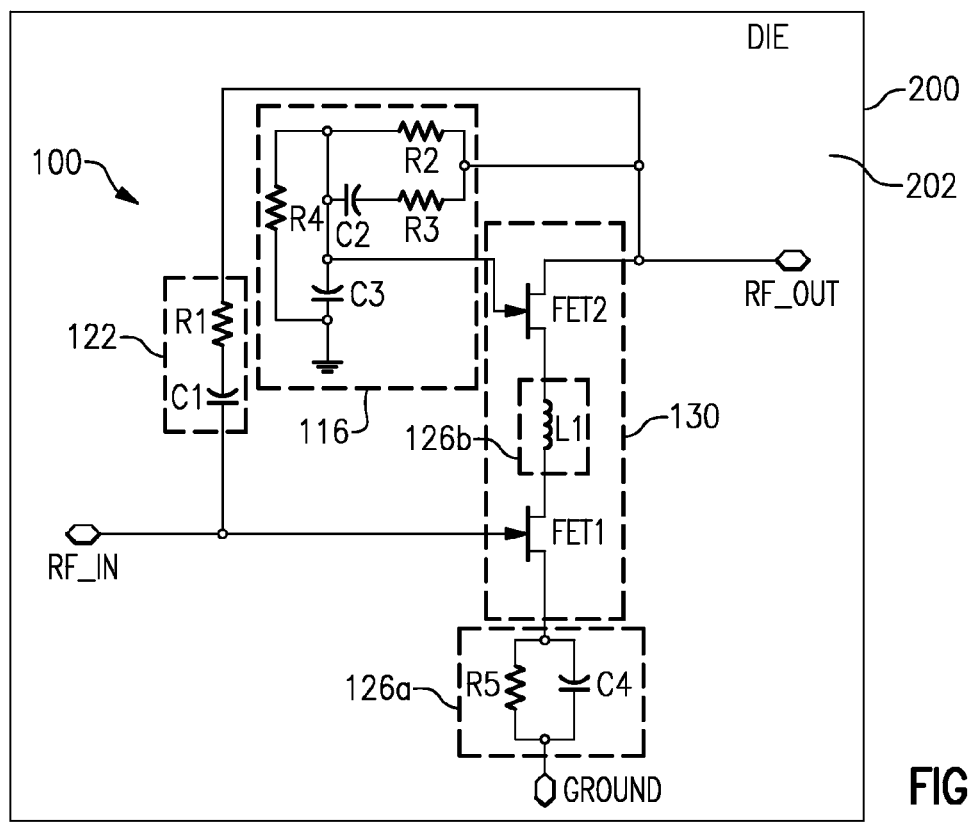
FIG. 12 shows a more specific example of the die of FIG. 11.

FIG. 12 is a more specific example of the die 200 of FIG. 11, similar to the LNA architecture of FIG. 5 being a more specific example of the LNA architecture 100 of FIG. 4. Similar to the example of FIG. 11, substantially all of the components associated with the LNA 130, substantially all of the components associated with the first feedback circuit 116, substantially all of the components associated with the second feedback circuit 122, and substantially all of the components associated with the passive circuits 126a, 126b can be implemented on and/or within a substrate 202 of the die 200. In some embodiments, the substrate 202 can be a substrate utilized for the LNA 130. For example, the substrate 202 can be a GaAs substrate configured for pseudomorphic high-electron-mobility transistors (pHEMT).

Figure 13A:
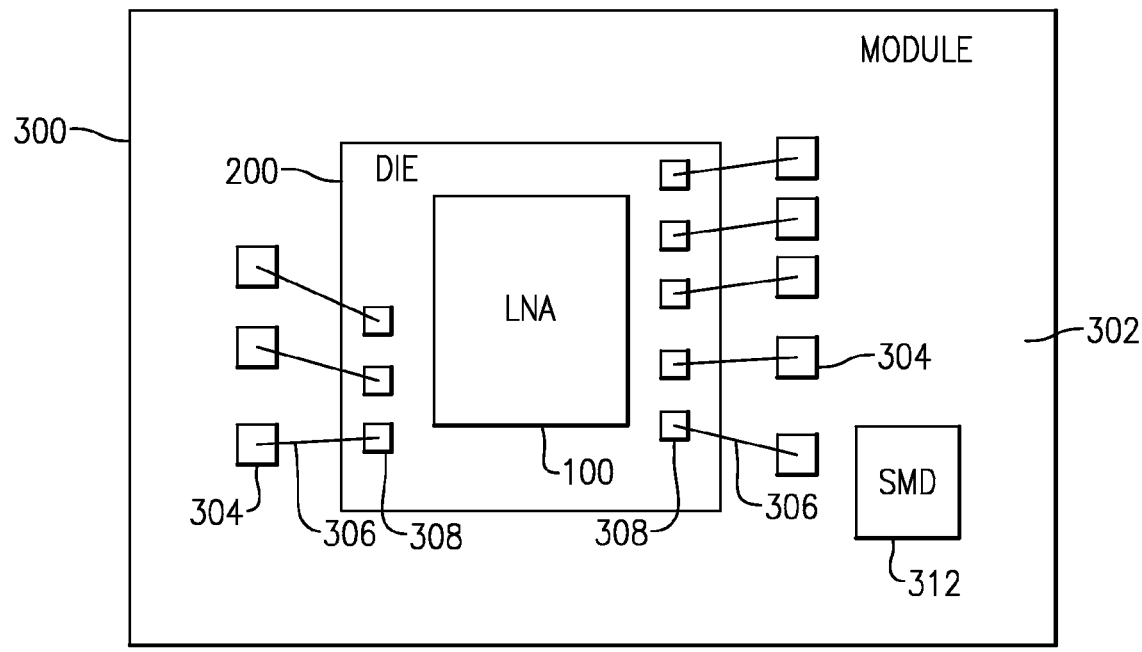
FIGS. 13A and 13B show plan and side views of a packaged module having one or more features as described herein.

In some embodiments, a die having one or more features as described herein can be implemented in a module such as a packaged module. An example of such a module is shown in FIGS. 13A (plan view) and 13B (side view).

A module 300 is shown to include a packaging substrate 302. Such a packaging substrate can be configured to receive a plurality of components, and can include, for example, a laminate substrate. The components mounted on the packaging substrate 302 can include one or more die. In the example shown, a die 200 having an LNA 100 with feedback and passive circuits as described herein is shown to be mounted on the packaging substrate 302. The die 200 can be electrically connected to other parts of the module through connections such as connection-wirebonds 306. Such connection-wirebonds can be formed between contact pads 308 formed on the die 200 and contact pads 304 formed on the packaging substrate 302. In some embodiments, one or more surface mounted devices (SMDs) 312 can be mounted on the packaging substrate 302 to facilitate various functionalities of the module 300.

In some embodiments, the packaging substrate 302 can include electrical connection paths for interconnecting the various components with each other and/or with contact pads for external connections. For example, a connection path 322 is depicted as interconnecting the SMD 312 with an external-connection contact pad 324. In yet another example a connection path 322 is depicted as interconnecting the die 200 with ground-connection contact pads 326.

In some embodiments, a space above the packaging substrate 302 and the various components mounted thereon can be filled with an overmold structure 320. Such an overmold structure can provide a number of desirable functionalities, including protection for the components and wirebonds from external elements, and easier handling of the packaged module 300.

Figure 13B:
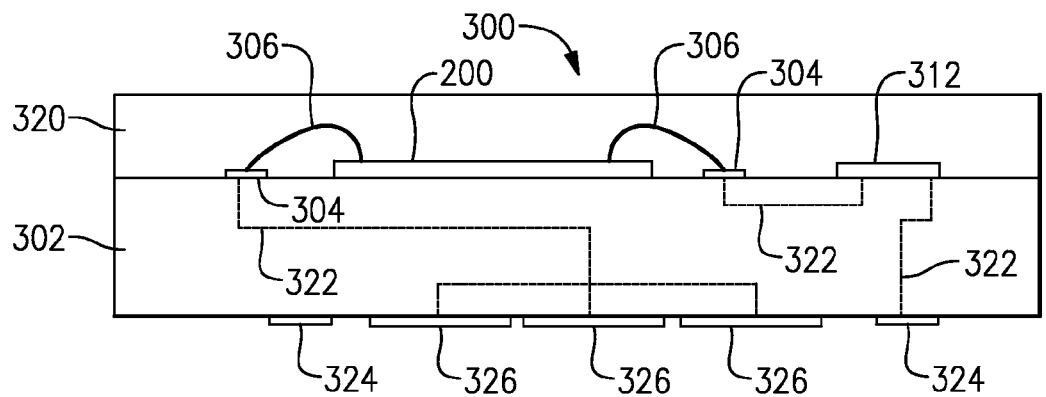
Figure 14:
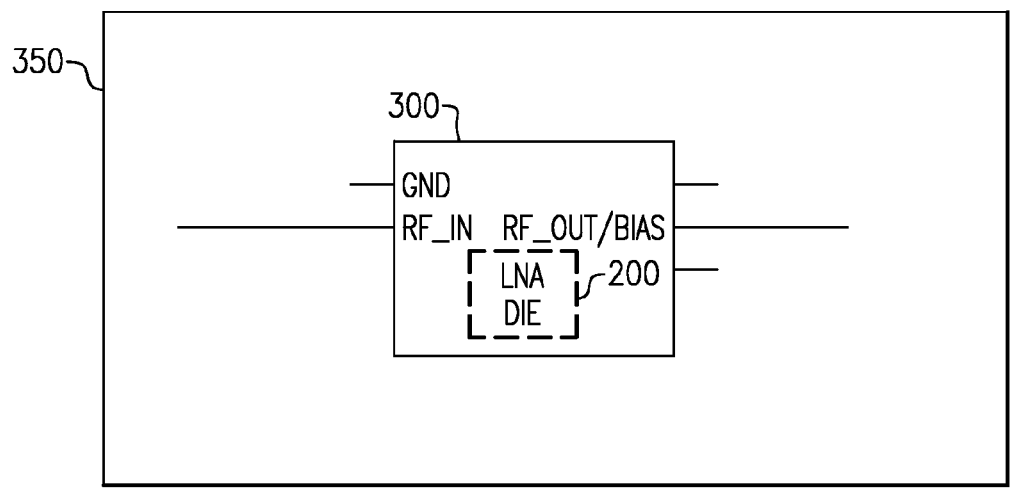
FIG. 14 shows an example where a module such as the example of FIGS. 13A and 13B can be mounted on a circuit board such as a phone board.

FIG. 14 shows an example where a module 300 such as the example described in reference to FIGS. 13A and 13B is mounted on a circuit board 350 such as a phone board. As described herein, such a module can include an LNA die 200 having substantially all of LNA and feedback/passive circuits for broadband operation. Accordingly, integration of such a module onto the circuit board 350 can be simple, and advantageously may not require any significant changes to an existing bill of materials.

Figure 15:
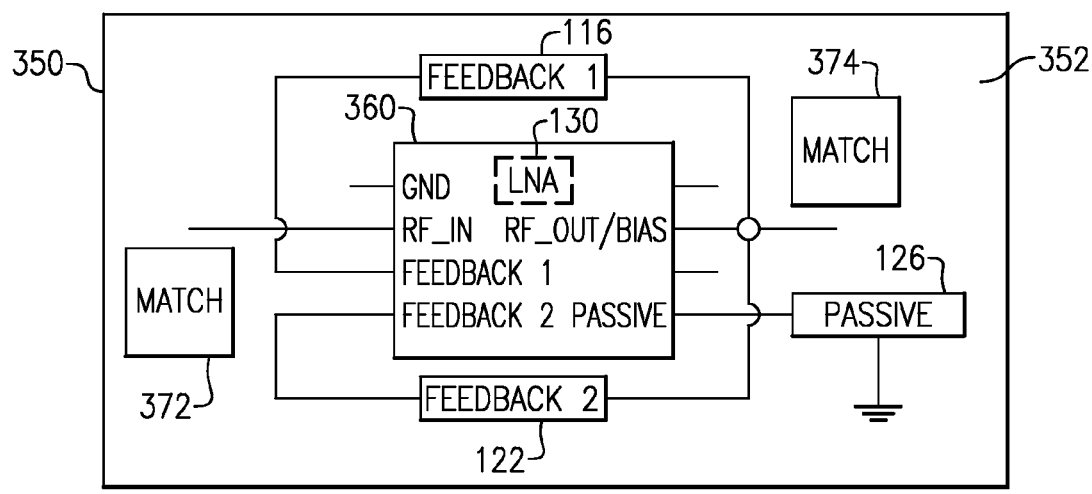
FIG. 15 shows an example where feedback and passive circuits having one or more features as described herein can be implemented on a circuit board.

As described herein, an LNA architecture 100 such as the example described in reference to FIGS. 4 and 5 can be implemented on a single die. In some embodiments, it may be desirable or necessary to implement some or all of the feedback and passive circuits outside of the die. For example, some or all of such feedback and passive circuits may be implemented on a module, on a circuit board, or some combination thereof. FIG. 15 shows an example where the feedback and passive circuits are implemented on a circuit board 350. The circuit board 350 (e.g., a phone board) can include a substrate 352 configured to receive a plurality of components. An RF module 360 such as an LNA module can have an LNA circuit 130 (e.g., formed on a die) can be mounted on the circuit board 350.

Such a module can include a number of input/output pins, and examples of such pins are shown. For example, a ground (GND) pin can be connected to a ground associate with the circuit board 350. A signal input pin (RF_IN) can be connected to a signal input node on the circuit board 350. A signal output pin (RF_OUT/BIAS) can be connected to a signal output node on the circuit board 350. In the example, a bias signal for the LNA circuit 130 can be provided through the same pin (RF_OUT/BIAS). A FEEDBACK1 pin can be connected to the first feedback circuit 116, which in turn can be connected to the signal output pin (RF_OUT/BIAS). Similarly, a FEEDBACK2 pin can be connected to the second feedback circuit 122, which in turn can be connected to the signal output pin (RF_OUT/BIAS). Similarly, a PASSIVE pin can be connected to the passive circuit 126, which in turn can be connected to the ground of the circuit board 320.

The circuit board 350 is shown to further include matching circuits 372, 374 configured to provide impedance matching for input and output of the LNA circuit 130. As described herein, and in some embodiments, components utilized for the first feedback circuit 116, the second feedback circuit 122, and the passive circuits 126a, 126b can be selected to have at least some overlap with components in one or more bill of materials associated with the various components implemented on the circuit board.

In some implementations, device(s) and/or circuit(s) having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 16:
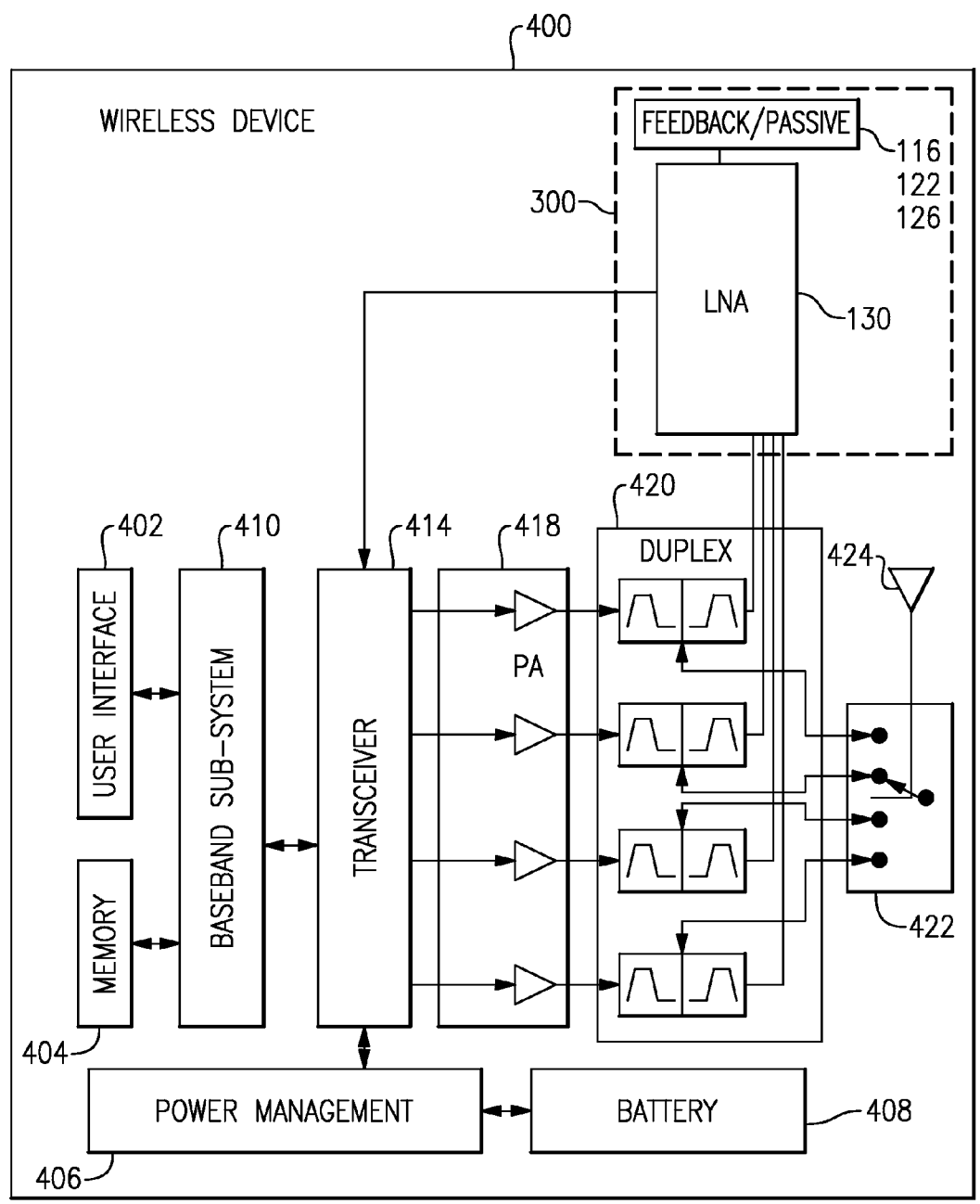
FIG. 16 depicts an example wireless device having one or more advantageous features described herein.

FIG. 16 schematically depicts an example wireless device 400 having one or more advantageous features described herein. In the context of the various examples as described herein, an LNA 130 and its feedback/passive circuits (collectively depicted as 116, 122, 126) can be part of a module 300. In some embodiments, other amplifier(s) associated with the wireless 400 can also benefit from one or more features of the present disclosure.

In the example wireless device 400, a power amplifier (PA) module 418 having a plurality of PAs can provide an amplified RF signal to the switch 422 (via a duplexer 420), and the switch 422 can route the amplified RF signal to an antenna 424. The PA module 418 can receive an unamplified RF signal from a transceiver 414 that can be configured and operated in known manners.

The transceiver 414 can also be configured to process received signals. Such received signals can be routed to the LNA from the antenna 424, through the duplexer 420. Various operations of the LNA can be facilitated by the feedback/passive circuits (116, 122, 126) as described herein.

The transceiver 414 is shown to interact with a baseband sub-system 410 that is configured to provide conversion between data and/or voice signals suitable for a user and RF signals suitable for the transceiver 414. The transceiver 414 is also shown to be connected to a power management component 406 that is configured to manage power for the operation of the wireless device 400. Such a power management component can also control operations of the baseband sub-system 410.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency amplifier architecture comprising:
 a radio-frequency amplifier including a first field-effect transistor and a second field-effect transistor arranged in a cascode configuration, each of the first field-effect transistor and the second field-effect transistor having a gate, a source, and a drain, the gate of the first field-effect transistor coupled to an input node for receiving an radio-frequency signal, the drain of the first field-effect transistor coupled to the source of the second field-effect transistor, the drain of the second field-effect transistor coupled to an output node for outputting an amplified radio-frequency signal;
 a first feedback circuit implemented between the drain of the second field-effect transistor and the gate of the second field-effect transistor, the first feedback circuit configured to provide gain control, the first feedback circuit including a first parallel combination and a second parallel combination connected in series between the drain of the second field-effect transistor and the ground, the first parallel combination including a first resistance parallel with a series combination of a second resistance and a first capacitance, the second parallel combination including a third resistance parallel with a second capacitance, a node between the first and second parallel combinations connected to the gate of the second field-effect transistor; and
 a second feedback circuit implemented between the drain of the second field-effect transistor and the gate of the first field-effect transistor, the second feedback circuit configured to provide an increase in a frequency range having a desirable range of gain.

2. The radio-frequency amplifier architecture of claim 1 further comprising a passive circuit implemented to provide stability for the radio-frequency amplifier.

3. The radio-frequency amplifier architecture of claim 2 wherein the passive circuit includes a first portion implemented between the source of the first field-effect transistor and a ground, the passive circuit further including a second portion implemented between the drain of the first field-effect transistor and the source of the second field-effect transistor.

4. The radio-frequency amplifier architecture of claim 2 wherein the passive circuit is configured to provide stability for the radio-frequency amplifier when additional noise and impedance change are introduced by the second feedback circuit.

5. The radio-frequency amplifier architecture of claim 2 wherein the radio-frequency amplifier is a low-noise amplifier.

6. The radio-frequency amplifier architecture of claim 5 wherein each of the first field-effect transistor and the second field-effect transistor is a pseudomorphic high-electron-mobility transistor.

7. The radio-frequency amplifier architecture of claim 6 wherein the pseudomorphic high-electron-mobility transistor includes a gallium arsenide substrate.

8. The radio-frequency amplifier architecture of claim 5 further comprising one or more matching circuits implemented to provide impedance matching for either or both of the received radio-frequency signal and the amplified radio-frequency signal.

9. The radio-frequency amplifier architecture of claim 5 wherein each of the first feedback circuit, the second feedback circuit, and the passive circuit is implemented on a die having the radio-frequency amplifier, thereby not needing an additional bill of materials to implement one or more functionalities associated with the radio-frequency amplifier architecture.

10. The radio-frequency amplifier architecture of claim 9 wherein the one or more functionalities includes a broadband functionality.

11. The radio-frequency amplifier architecture of claim 1 wherein the second feedback circuit includes a fourth resistance in series with a third capacitance.

12. The radio-frequency amplifier architecture of claim 11 wherein the first portion of the passive circuit includes a parallel combination of a fifth resistance and a fourth capacitance, and the second portion of the passive circuit includes an inductance.

13. A semiconductor die comprising:
a semiconductor substrate;
a radio-frequency amplifier implemented on the semiconductor substrate, the radio-frequency amplifier including a first field-effect transistor and a second field-effect transistor arranged in a cascode configuration, each of the first field-effect transistor and the second field-effect transistor having a gate, a source, and a drain, the gate of the first field-effect transistor coupled to an input node for receiving an radio-frequency signal, the drain of the first field-effect transistor coupled to the source of the second field-effect transistor, the drain of the second field-effect transistor coupled to an output node for outputting an amplified radio-frequency signal;
a first feedback circuit implemented on the semiconductor substrate, the first feedback circuit configured to couple the drain of the second field-effect transistor and the gate of the second field-effect transistor, the first feedback circuit further configured to provide gain control, the first feedback circuit including a first parallel combination and a second parallel combination connected in series between the drain of the second field-effect transistor and the ground, the first parallel combination including a first resistance parallel with a series combination of a second resistance and a first capacitance, the second parallel combination including a third resistance parallel with a second capacitance, a node between the first and second parallel combinations connected to the gate of the second field-effect transistor;
a second feedback circuit implemented on the semiconductor substrate, the second feedback circuit configured to couple the drain of the second field-effect transistor and the gate of the first field-effect transistor, the second feedback circuit further configured to provide an increase in a frequency range having a desirable range of gain; and
a passive circuit implemented on the semiconductor substrate, the passive circuit configured to provide stability for the radio-frequency amplifier.

14. The semiconductor die of claim 13 wherein the semiconductor substrate includes gallium arsenide.

15. The semiconductor die of claim 14 wherein the radio-frequency amplifier is a low-noise amplifier.

16. The semiconductor die of claim 15 wherein each of the first field-effect transistor and the second field-effect transistor is a pseudomorphic high-electron-mobility transistor.

17. A method of fabricating a radio-frequency die, the method comprising:
providing a semiconductor substrate;
forming a radio-frequency amplifier on the semiconductor substrate, the radio-frequency amplifier including a first field-effect transistor and a second field-effect transistor arranged in a cascode configuration, each of the first field-effect transistor and the second field-effect transistor having a gate, a source, and a drain, the gate of the first field-effect transistor coupled to an input node for receiving a radio-frequency signal, the drain of the first field-effect transistor coupled to the source of the second field-effect transistor, the drain of the second field-effect transistor coupled to an output node for outputting an amplified radio-frequency signal;
forming a first feedback circuit on the semiconductor substrate, the first feedback circuit configured to couple the drain of the second field-effect transistor and the gate of the second field-effect transistor, the first feedback circuit further configured to provide gain control, the first feedback circuit including a first parallel combination and a second parallel combination connected in series between the drain of the second field-effect transistor and the ground, the first parallel combination including a first resistance parallel with a series combination of a second resistance and a first capacitance, the second parallel combination including a third resistance parallel with a second capacitance, a node between the first and second parallel combinations connected to the gate of the second field-effect transistor;
forming a second feedback circuit on the semiconductor substrate, the second feedback circuit configured to couple the drain of the second field-effect transistor and the gate of the first field-effect transistor, the second feedback circuit further configured to provide an increase in a frequency range having a desirable range of gain; and
forming a passive circuit on the semiconductor substrate, the passive circuit configured to provide stability for the radio-frequency amplifier.

18. The method of claim 17 wherein the radio-frequency amplifier is a low-noise amplifier.

19. The method of claim 18 wherein the semiconductor substrate is a gallium arsenide substrate.

* * * * *